(12) United States Patent
Yang

(10) Patent No.: US 12,431,689 B2
(45) Date of Patent: Sep. 30, 2025

(54) OPTOELECTRONIC DEVICE AND METHOD OF MANUFACTURE THEREOF

(71) Applicant: CELESTIAL AI INC., Santa Clara, CA (US)

(72) Inventor: Hua Yang, Cork (IE)

(73) Assignee: Celestial AI Inc., Santa Clara, CA (US)

(*) Notice: Subject to any disclaimer, the term of this patent is extended or adjusted under 35 U.S.C. 154(b) by 427 days.

(21) Appl. No.: 17/364,837

(22) Filed: Jun. 30, 2021

(65) Prior Publication Data
US 2022/0013988 A1    Jan. 13, 2022

(30) Foreign Application Priority Data
Jul. 6, 2020 (GB) ...................................... 2010320

(51) Int. Cl.
| | |
|---|---|
| H01S 5/22 | (2006.01) |
| G02F 1/025 | (2006.01) |
| H01S 5/042 | (2006.01) |
| H01S 5/30 | (2006.01) |
| H10F 71/00 | (2025.01) |
| H10F 77/124 | (2025.01) |
| H10F 77/14 | (2025.01) |

(52) U.S. Cl.
CPC ............. H01S 5/22 (2013.01); G02F 1/025 (2013.01); H01S 5/0421 (2013.01); H01S 5/305 (2013.01); H10F 71/127 (2025.01); H10F 77/124 (2025.01); H10F 77/147 (2025.01)

(58) Field of Classification Search
CPC .......... H01S 5/22; H01S 5/0421; H01S 5/305; H01S 5/2086; H01S 5/0208; H01S 5/2224; H10F 77/147; H10F 77/124; H10F 71/127; G02F 1/025; H01L 31/035281; H01L 31/0304; H01L 31/184

USPC .......................................................... 438/31
See application file for complete search history.

(56) References Cited

U.S. PATENT DOCUMENTS

| | | | | |
|---|---|---|---|---|
| 6,134,368 | A * | 10/2000 | Sakata | H01S 5/227 372/50.1 |
| 2004/0016920 | A1* | 1/2004 | Akiyama | G02F 1/2257 257/14 |
| 2020/0363664 | A1* | 11/2020 | Saito | H01S 5/50 |

FOREIGN PATENT DOCUMENTS

WO    WO 2019/151044 A1    8/2019

OTHER PUBLICATIONS

U.K. Intellectual Property Office Search and Examination Report, dated Dec. 22, 2020, for Patent Application No. GB2010320.6, 5 pages.

\* cited by examiner

*Primary Examiner* — Nathan W Ha
(74) *Attorney, Agent, or Firm* — John Maldjian, Esq.; Stevens & Lee PC

(57) ABSTRACT

A method of fabricating an optoelectronic component, performed on a multi-layered wafer disposed on a substrate. The method comprises the steps of: etching the multi-layered wafer, thereby defining a slab and a multi-layered ridge, the slab having an upper surface below the ridge and being located between the multi-layered ridge and the substrate; selectively epitaxially growing a III-V semiconductor cladding adjacent to a first and second sidewall of the ridge, the cladding layer extending from the upper surface of the slab along the first and second sidewalls, and thereby cladding an optically active waveguide within the multi-layered ridge; and providing a first and second electrical contact, which electrically connect to a layer of the multi-layered ridge and the slab respectively.

22 Claims, 5 Drawing Sheets

OPTOELECTRONIC DEVICE AND METHOD OF MANUFACTURE THEREOF

CROSS-REFERENCE TO RELATED APPLICATION(S)

This application claims priority to United Kingdom Patent Application No. 2010320.6, filed in the United Kingdom Intellectual Property Office on Jul. 6, 2020, which is incorporated by reference herein in its entirety.

FIELD OF THE INVENTION

The present invention relates to an optoelectronic device and method of manufacture thereof.

BACKGROUND

In fabricating high speed (e.g. radio-frequency) optoelectronic components, such as lasers, modulators, and photodiodes, the total fabrication times are usually much longer and the process more complicated as compared to DC components due to the large number of processing steps required.

One reason for this is the planarization step, which is needed during high-speed component fabrication in order to bridge the probing electric metal pad and the ohmic contact to the device without introducing serious parasitic capacitance (which would lower speed). Previously, benzocyclobutene (BCB) has been used for this purpose due to its low dielectric constant and low refractive index. However, the process for planarization using BCB is complex and time-consuming, as well as risky due to the inconsistent yield (there is the possibility of non-uniformity during planarization). Notably, BCB-planarization requires multiple applications of coatings and baking, followed by an etch to remove the excess above the optoelectronic device. Moreover, after curing, a BCB-planarized chip cannot be exposed to temperatures in excess of 280° C., which can be a requirement for some post-process fabrication steps (for example p and n metal semiconductor alloy annealing). BCB is also a type of polymer, which means it can suffer from thermal stability issues.

An alternative method is to use silicon oxynitride (SiON) instead of BCB. However it is more difficult to achieve planarization with SiON than BCB. The planarization process is therefore more complicated, and the few micron thick dielectric has a risk of high strain which could potentially lead to failure of these devices. Typically the growth required is on the order of 2.5 μm or more, and this takes quite a long time (between half a day and a full day depending on the deposition rate and also the strain management during the deposition, e.g. the deposition is completed a few layers at a time with a relaxing period in between). Further, due to the non-selective growth nature of SiON, it has the same deposition rate on all areas of the wafer and so the part deposited on top of a waveguide ridge needs to be etched away. This etch is a time consuming step, and moreover after the etch notches are formed on either side of the ridge which can cause electrical leakage during subsequent metallisation steps as shown in FIG. 1.

It is desirous then to fabricate high-speed optoelectronic components in a simpler manner, whilst still achieving good levels of planarization uniformity.

SUMMARY

Accordingly, in a first aspect, embodiments of the invention provide a method of fabricating an optoelectronic component, performed on a multi-layered wafer disposed on a substrate, the method comprising the steps of:

performing one or more etches to the multi-layered wafer, thereby defining a slab and a multi-layered ridge, the slab having an upper surface below the ridge, and being located between the multi-layered ridge and the substrate;

selectively epitaxially growing a III-V semiconductor cladding adjacent to a first and second sidewall of the ridge, the cladding layer extending from the upper surface of the slab along the first and second sidewalls, and thereby cladding an optically active waveguide within the multi-layered ridge; and providing a first and second electrical contact, which electrically connect to a layer of the multi-layered ridge and the slab respectively.

Such a method results in an improved planarization, and consequentially an improved optoelectronic device. The method also has a higher yield, and is less complex.

Optional features of the method will now be set out. These are applicable singly or in any combination with any aspect.

The substrate may be a semi-insulating substrate, with a relatively high degree of electrical resistivity. The substrate may be formed of iron doped InP, with an electrical resistivity of greater than or equal to $5 \times 10^6$ Ω·cm. The first and second electrical contacts may be provided on a platform which supports them. The III-V semiconductor cladding may be undoped. By undoped, it may be meant that no active doping step is performed to intentionally dope the cladding, but it may be unintentionally doped during regrowth due to the background doping. The III-V semiconductor cladding may be doped. The dopant used to dope the III-V semiconductor cladding may be iron to make it highly electrically resistive (e.g. higher, or significantly higher, in electrical resistance than the layers of the multi-layered ridge and slab to which the first and second electrical contact electrically connect). The III-V semiconductor cladding may be formed from one of: InP, GaAs, GaSb, or GaP. The III-V semiconductor cladding may be formed from one of a binary of III-V semiconductors from which the substrate is formed (e.g., for a InP substrate, the III-V semiconductor cladding may be formed from In or P). In one example, the III-V semiconductor cladding may be formed from Fe doped InP. The optically active waveguide may be a ridge waveguide, in that the optical mode of the waveguide is chiefly confined to the ridge and does not extend (or minimally extends) into the slab. The optically active waveguide may be a rib waveguide, in that the optical mode of the waveguide is chiefly confined in the slab, and is guided by the rib/ridge. The III-V semiconductor cladding may have a refractive index which is lower than that of the optically active waveguide.

The multi-layered wafer may include one or more III-V semiconductor layers. In one example, all layers (e.g. p-i-n or n-i-p structure) in the multi-layered wafer are formed of a III-semiconductor.

The optically active waveguide may form a part of one of: a photodiode; an electro-absorption modulator; and a laser.

The cladding may extend from the upper surface of the slab along the first and second sidewalls of the ridge to a point equal in height to an upper surface of a doped layer of the multi-layered ridge. The doped layer may be an uppermost layer of the multi-layered ridge.

By upper surface, it may be meant the surface of the slab which is the furthest from the substrate. Generally, as used herein, 'up' or 'upper' refers to a direction away from the plane of the substrate, whereas 'down' or 'lower' refers to a direction towards the plane of the substrate.

Prior to a first etch of the multi-layered wafer the method may include depositing a first mask over a region of the multi-layered wafer which is to form the multi-layered ridge, and subsequently etching the unmasked region. The first mask may be retained after the etching, and may be present during the selective epitaxial growth of the III-V semiconductor cladding layer. Due to a lattice mismatch between the first mask and the III-V semiconductor forming the cladding layer, growth on top of the multi-layered ridge can be deterred. The first mask may be formed of silicon dioxide. The first etch may extend only part way into a base layer of the multi-layered wafer, which is adjacent to the substrate. The base layer may be the lowermost layer of the multi-layered wafer i.e. the one closest to the substrate. Prior to a second etch, the method may further include depositing a second mask over a portion of the base layer, and etching the unmasked region to define the slab. The second mask may be formed of silicon nitride. The second mask may be removed after the slab defining etch. By forming the second mask of silicon nitride, it can be ensured that the first mask (formed of silicon dioxide) is not removed then the second mask is removed. The first mask may be removed after the selective epitaxial growth of the III-V semiconductor cladding layer. The selective epitaxial growth may comprise a $SiO_2$ or $Si_3N_4$ mask pair, with an open area in between. During the selective epitaxial growth, deposition/growth will occur in the open area in between the masks but not on the masks themselves. For examples in which a quantum well structure is formed, a different open gap is used between the mask pair, and results in a different growth rate and so a different band gap in the quantum wells.

Providing the first electrical contact may include depositing a metal layer on top of the multi-layered ridge, said metal layer being electrically connected to an uppermost layer of the multi-layered ridge, and depositing a first contact pad on an upper surface of the cladding such that it is in electrical contact with the metal layer.

Providing the second electrical contact may include forming a via through the cladding, said via exposing a region of the upper surface of the multi-layered ridge, and subsequently depositing a second contact pad both: partially in the via such that it is in electrical contact with the slab, and on an upper surface of the cladding.

In a second aspect, embodiments of the invention provide an optoelectronic device fabricated according to the method of the first aspect, including any optional features as set out with reference thereto.

In a third aspect, embodiments of the invention provide an optoelectronic device comprising:
 a multi-layered ridge, containing an optically active waveguide;
 a slab, located between the multi-layered ridge and a substrate;
 a III-V semiconductor cladding, located adjacent to a first and second sidewall of the ridge, and extending from the upper surface of the slab along the first and second sidewalls, thereby cladding the optically active waveguide within the multi-layered ridge; and
 a first and second electrical contact, which electrically connect to a layer of the multi-layered ridge and the slab respectively.

Such an optoelectronic device has a more planar surface, and can be fabricated more consistently.

Optional features of the optoelectronic device will now be set out. These are applicable singly or in any combination with any aspect.

The III-V semiconductor cladding may be undoped. By undoped, it may be meant that no active doping step is performed to intentionally dope the cladding, but it may be unintentionally doped during subsequent processing steps. The III-V semiconductor cladding may be doped. The dopant used to dope the III-V semiconductor cladding may be iron. This can ensure that the cladding layer is resistive or highly resistive. Whilst iron is used in some examples, any dopant which increases the resistivity of the III-V semiconductor cladding layer can be used. The III-V semiconductor cladding may be formed from one of: InP, GaAs, GaSb, or GaP. In one example, the III-V semiconductor cladding may be formed from Fe doped InP.

The multi-layered wafer may include one or more III-V semiconductor layers. In one example, all layers in the multi-layered wafer are formed of a III-semiconductor.

The optically active waveguide may form a part of one of: a photodiode; an electro-absorption modulator; and a laser.

The cladding may extend from the upper surface of the slab along the first and second sidewalls of the ridge to a point equal in height to an upper surface of a doped layer of the multi-layered ridge. The doped layer may be an uppermost layer of the multi-layered ridge.

The first electrical contact may include a metal layer, located on top of the multi-layered ridge, said metal layer being electrically connected to an uppermost layer of the multi-layered ridge, and also being electrically connected to a first contact pad located on an upper surface of the cladding.

The second electrical contact may be provided in a via through the cladding, said second electrical contact being electrically connected to the slab and a second contact pad located on an upper surface of the cladding Further aspects of the present invention provide: a computer program comprising code which, when run on a computer, causes the computer to perform the method of the first aspect; a computer readable medium storing a computer program comprising code which, when run on a computer, causes the computer to perform the method of the first aspect; and a computer system programmed to perform the method of the first aspect.

BRIEF DESCRIPTION OF THE DRAWINGS

Embodiments of the invention will now be described by way of example with reference to the accompanying drawings in which.

DETAILED DESCRIPTION AND FURTHER OPTIONAL FEATURES

Aspects and embodiments of the present invention will now be discussed with reference to the accompanying figures. Further aspects and embodiments will be apparent to those skilled in the art.

Figure 1:
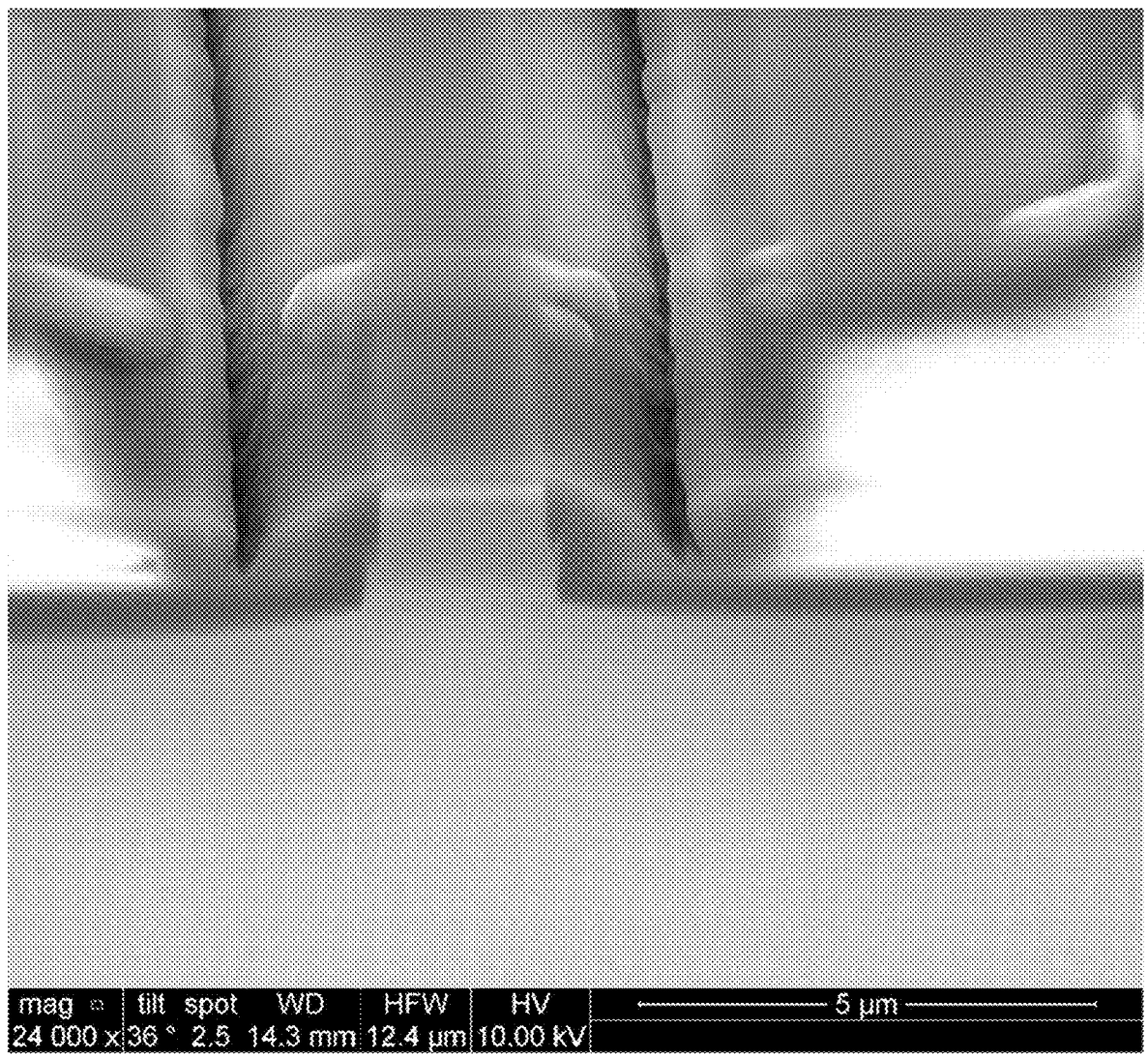
FIG. 1 shows an SEM image of a prior art device formed with a SiON cladding layer.
Figure 2:
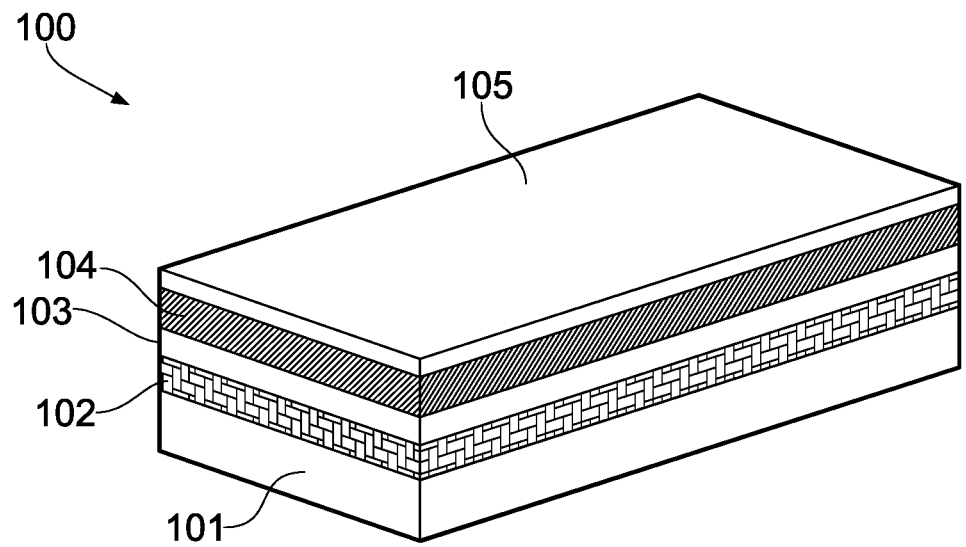
FIG. 2 is a perspective view of a multi-layered wafer.

FIG. 2 is a perspective view of a multi-layered wafer 100. In this example, the wafer comprises four layers disposed on top of a substrate 101. The substrate is a semi-insulating indium phosphide (InP) substrate. On top of the substrate is an n-doped indium phosphide layer 102, which functions as a lower cladding layer to an undoped waveguide core layer 103. The undoped waveguide core layer 103 is sandwiched between the n-doped layer 102 and a p-doped indium phosphide layer 104, which functions as an upper cladding layer. On top of the p-doped indium phosphide layer 104 is a heavily p-doped (i.e. p+) indium gallium arsenide (InGaAs) layer 105. The wafer is provided, for example, by sequentially blanket or epitaxially depositing the material for each layer and performing appropriate doping steps. Whilst in this example the multi-layered wafer comprises four layers on a substrate, the wafer may contain further or fewer layers.

Figure 3:
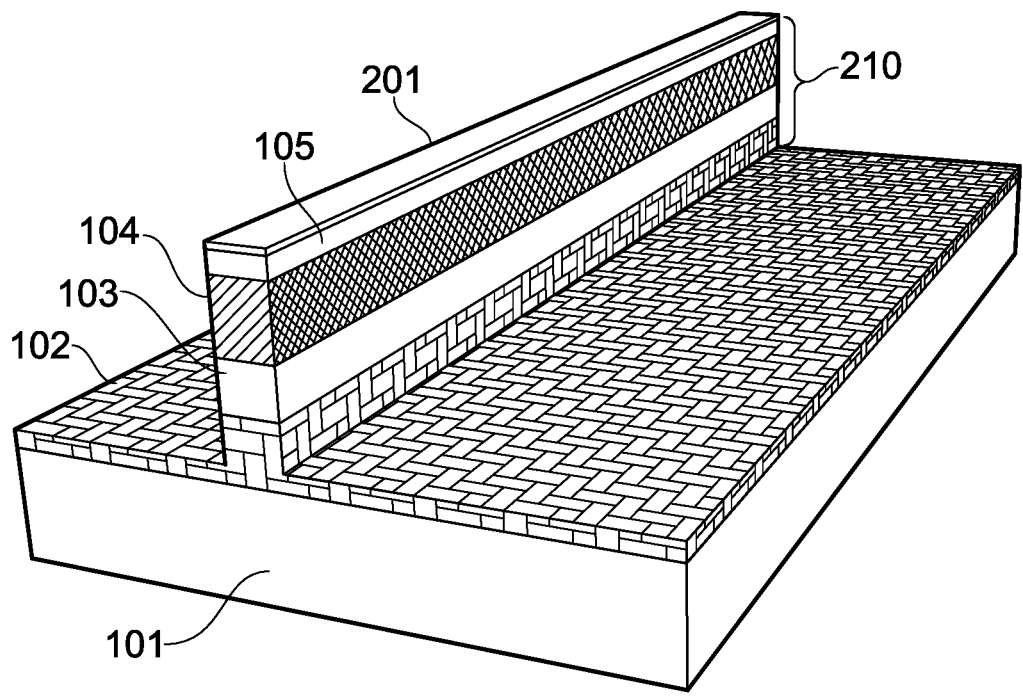
FIG. 3 is a perspective view of the multi-layered wafer of FIG. 2 after a first etch.

FIG. 3 is a perspective view of the multi-layered wafer of FIG. 2 after a first etch. Prior to the first etch, a first mask 201 is deposited over the upper surface of the uppermost layer in the multi-layered wafer (in this example the heavily p doped InGaAs layer 105). Next, the mask is patterned through lithography and etched as patterned. Finally, as shown in FIG. 3, the unmasked region of the wafer is etched through layers 104, 103, and only part way through 102. In this example, the first mask is formed of silicon dioxide (SiO$_2$). The width of the mask 201, when patterned, defines the width multi-layered ridge 210 which is a result of the first etch. The multi-layered ridge includes layers 105-103, as well as a portion of layer 102.

Figure 4:
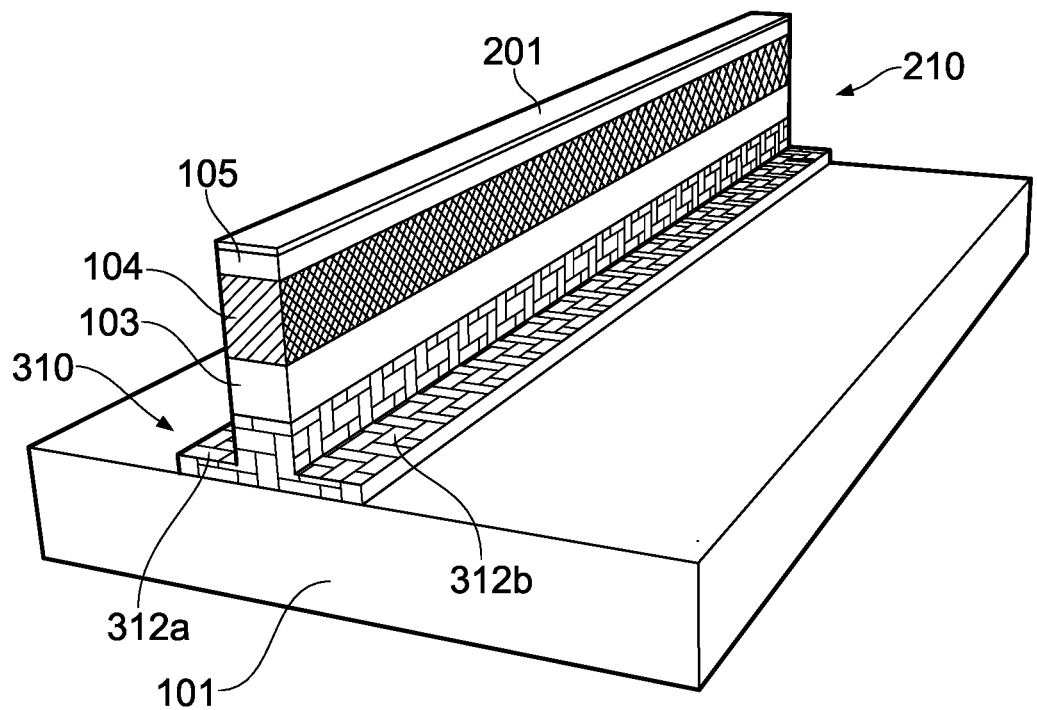
FIG. 4 is a perspective view of a slab and multi-layered ridge formed by a second etch performed on the structure of FIG. 3.

FIG. 4 is a perspective view of a slab 310 formed by a second etch performed on the structure of FIG. 3. Prior to the second etch, a second mask (not shown) is deposited over the upper surface of the entire structure. This second mask is then patterned through lithography and etched as patterned. The pattern defines the width of the slab 310 to be formed through the subsequent etch, which removes the remainder of layer 102 not covered by the mask and exposes an upper surface of the substrate. In this example, the second mask is formed of silicon nitride (SiN$_x$). The result is a slab region 310, which is located between the substrate 101 and the multi-layered ridge 210 and extends only partway across a width of the substrate. The slab region 310 has a first 312a and second 312b upper surface, which are the surfaces of the slab furthest from substrate 101.

Figure 5:
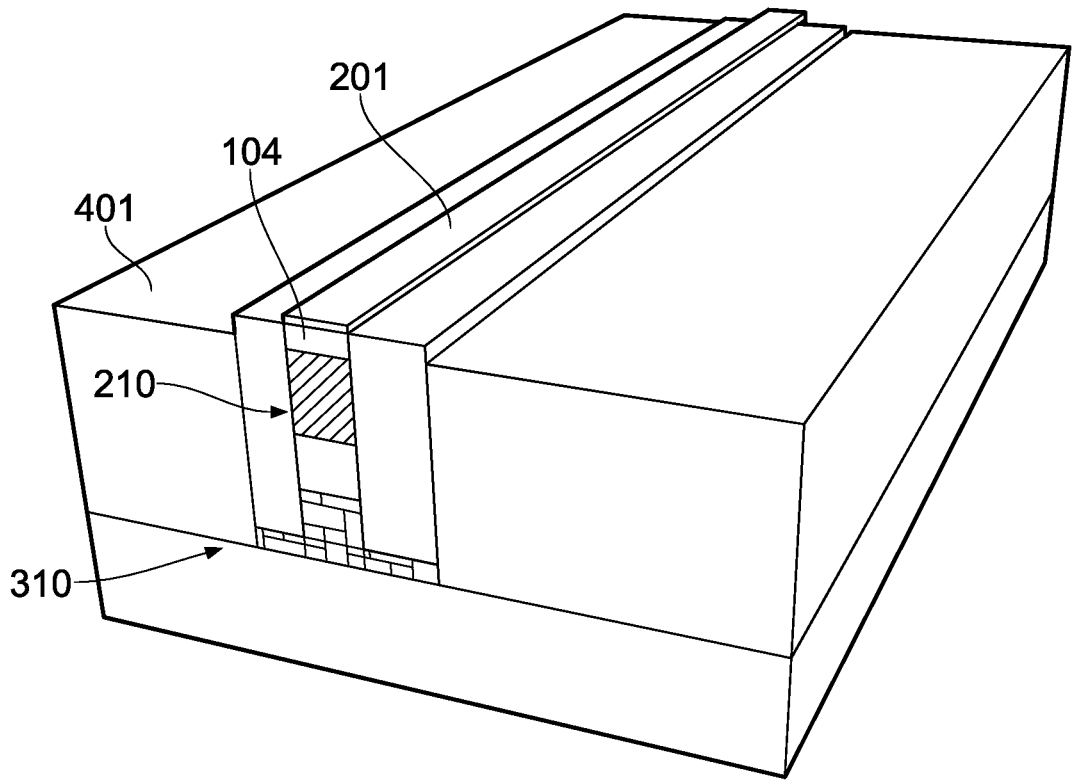
FIG. 5 is a perspective view of the slab and multi-layered ridge after a III-V semiconductor cladding layer has been epitaxially grown.

FIG. 5 is a perspective view of the slab and multi-layered ridge after a III-V semiconductor cladding layer has been epitaxially grown. This involves the use of a selective area growth technique, in which a III-V cladding material 401 is epitaxially grown from at least the first 312a and second 312b upper surfaces of the slab 310. The cladding material is also grown from the exposed substrate 101, either side of the slab 10. The growth is halted when an uppermost surface of the cladding material 401 adjacent to the multi-layered ridge 210 is aligned with an uppermost surface of the uppermost layer of the ridge (not including the mask 201). A planarized device results. As can be seen in FIG. 5, because of the uniform growth rate, this results in a 'step' between the cladding material 401 which has been grown from the upper surface(s) of the slab 310 and the cladding material which has been grown from the substrate.

Figure 6:
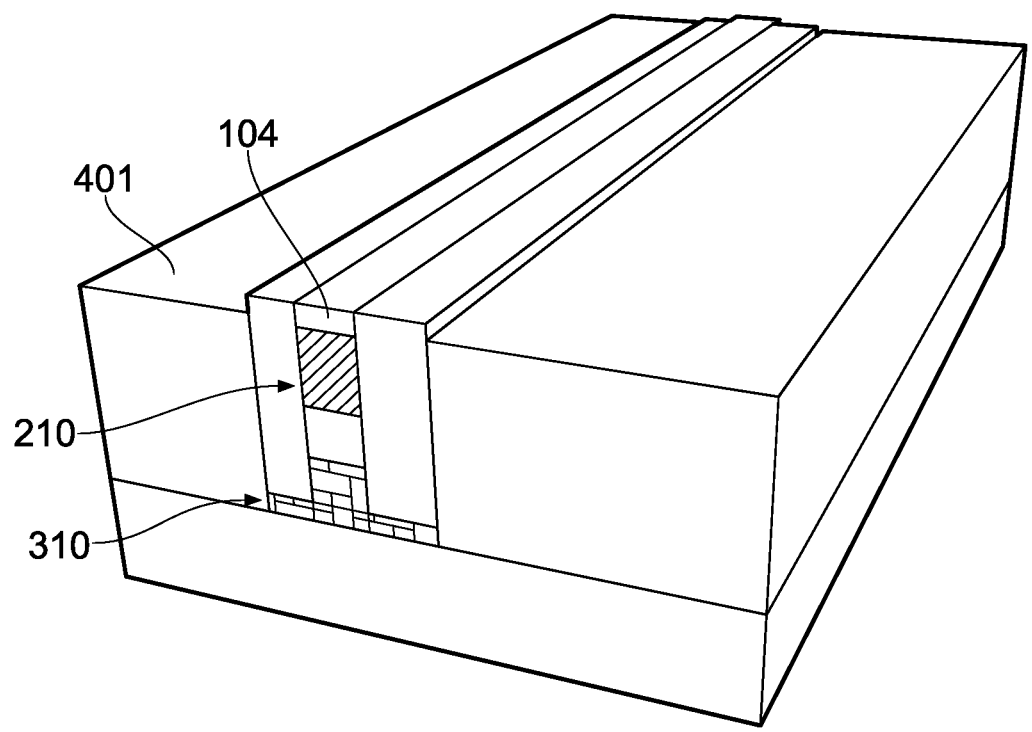
FIG. 6 is a perspective view of the slab and multi-layered ridge after a third etch which removes the SiO2 mask and exposes the semiconductor top surface to form the contact with metal.
Figure 7:
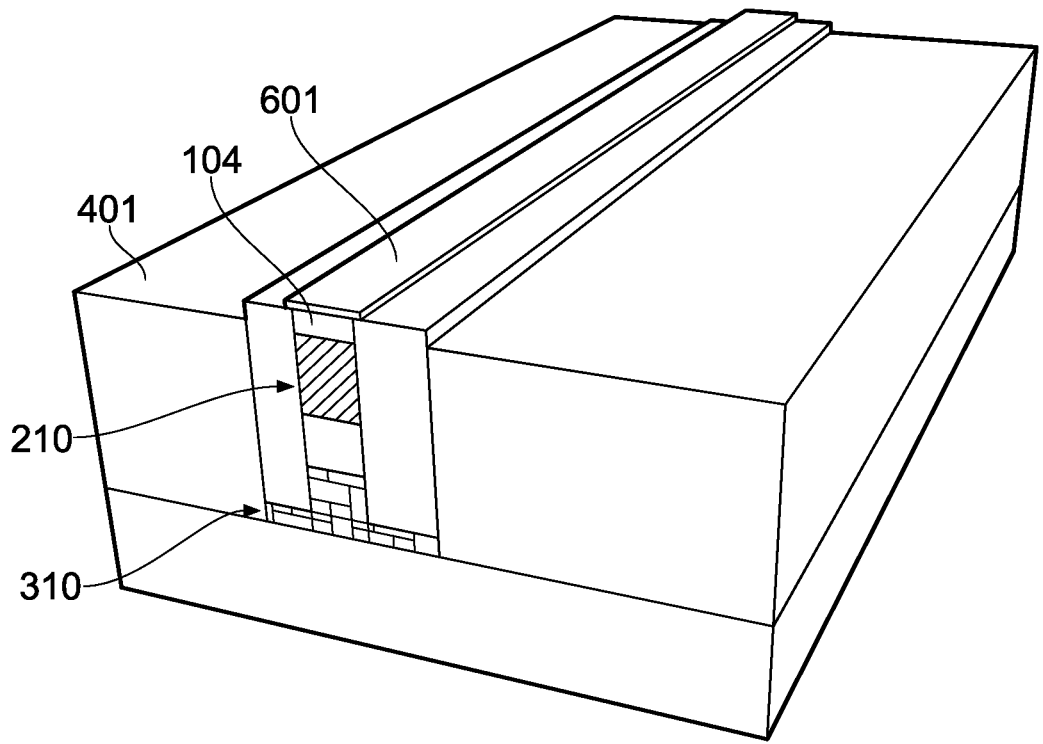
FIG. 7 is a perspective view of the slab and multi-layered ridge after a metallization step.

FIG. 6 is a perspective view of the slab and multi-layered ridge after a third etch. In the third etch, the first mask 201 is etched away using a dry or wet etching technique. This exposes an uppermost surface of the uppermost layer 104 in the multi-layered ridge 210. FIG. 7 is a perspective view of the slab and multi-layered ridge after a metallization step. In the metallization step, a metal layer 601 is disposed over the upper surface of the uppermost layer 104 in the ridge 210. The metal layer is therefore in electrical contact with this layer 104.

Figure 8:
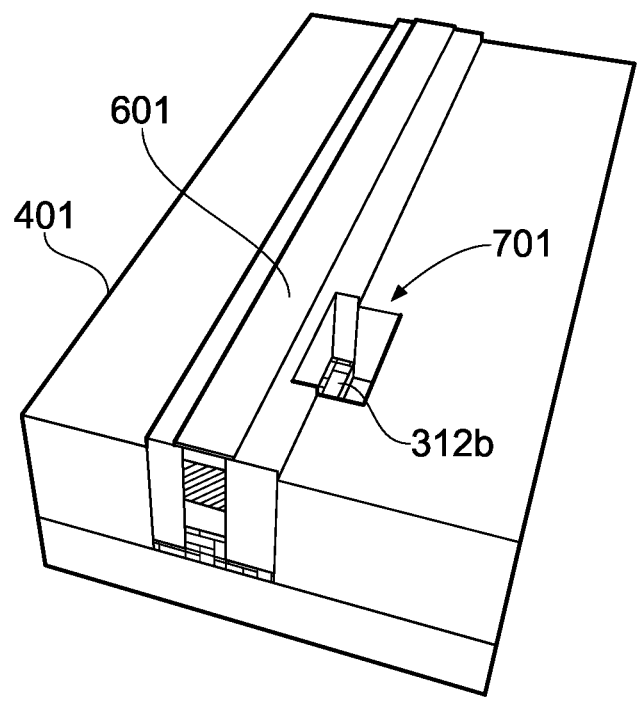
FIG. 8 is a perspective view of the slab and multi-layered ridge after a via is opened in the cladding layer.
Figure 9:
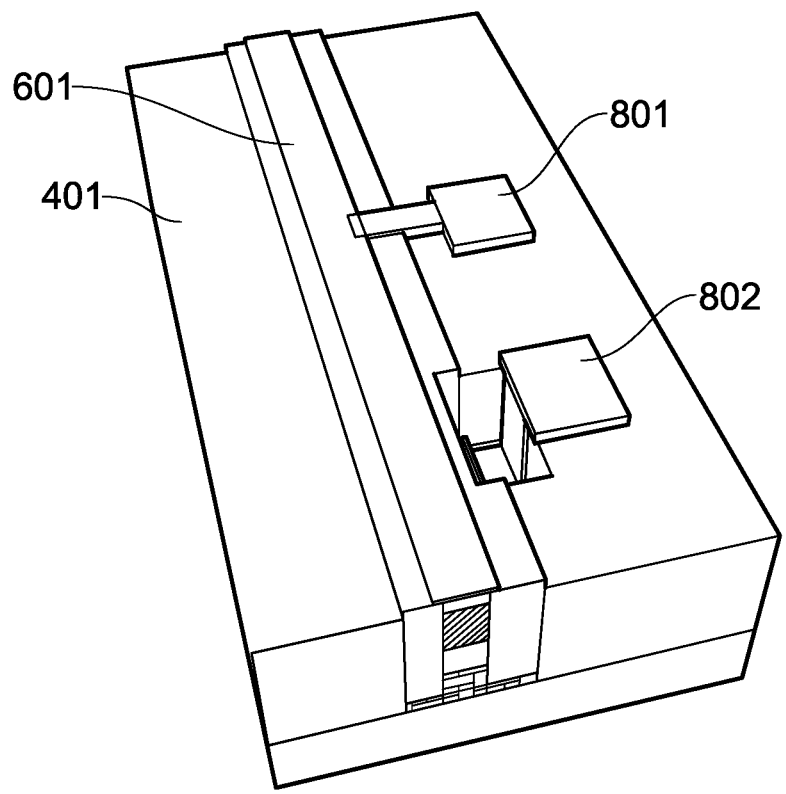
FIG. 9 is a perspective view of the slab and multi-layered ridge after an n and p contact are provided.

FIG. 8 is a perspective view of the slab and multi-layered ridge after a via 701 is opened in the cladding layer. The via 701 is opened by first patterning the upper surface of the device, and then etching through the cladding layer so as to expose a portion of the upper surface 312b. FIG. 9 is a perspective view of the slab and multi-layered ridge after a p contact pad 801 and an n contact pad 802 are provided. The n and p contact pads are provided through a further metallization process. The p contact pad 801 extends to and electrically connects with the metal layer 601 provided previously. The n contact pad 802 extends through the via, so as to electrically connect to the upper surface 312 of the slab 310. It is also disposed on an upper surface of the cladding 401, so that wire bonds or other connectors can be attached to both the p and n contact pads.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

LIST OF FEATURES

- 100 Multi-layered wafer
- 101 Substrate
- 102 Lower doped layer
- 103 Undoped core
- 104 Upper doped layer
- 105 Heavily doped layer
- 201 First mask
- 210 Multi-layered ridge
- 310 Slab
- 312a 312b Upper surface of slabs
- 401 Cladding
- 601 Metal layer
- 701 Via
- 801 First contact pad
- 820 Second contact pad

The invention claimed is:

1. An optoelectronic device, comprising:
   a substrate;
   a multi-layered ridge on the substrate, the multi-layered ridge containing an optically active waveguide;
   a slab, located between the multi-layered ridge and the substrate, a material of a lowermost layer of the multi-layered ridge being the same as, and continuous with, a material of the slab;
   a III-V semiconductor cladding, located adjacent to a first and second sidewall of the multi-layered ridge, and extending from an upper surface of the slab along the first and second sidewalls, thereby cladding the optically active waveguide within the multi-layered ridge; and a first and second electrical contact, which electrically connect to a layer of the multi-layered ridge and the slab respectively, wherein a distance between a first portion of a top surface of the substrate under the slab and a top surface of the III-V semiconductor cladding is greater than a distance between a second portion of the top surface of the substrate adjacent to the slab and the top surface of the III-V semiconductor cladding.

2. The optoelectronic device of claim 1, wherein the III-V semiconductor cladding is undoped.

3. The optoelectronic device of claim 1, wherein the III-V semiconductor cladding is doped with iron.

4. The optoelectronic device of claim 1, wherein the III-V semiconductor cladding is formed from one of: InP and GaAs.

5. The optoelectronic device of claim 1, wherein the multi-layered ridge includes one or more III-V semiconductor layers.

6. The optoelectronic device of claim 1, wherein the optically active waveguide forms a part of one of: a photodiode; an electro-absorption modulator; or a laser.

7. The optoelectronic device of claim 1, wherein the III-V semiconductor cladding extends from the upper surface of the slab along the first and second sidewalls of the multi-layered ridge to a point equal in height to an upper surface of a doped layer of the multi-layered ridge.

8. The optoelectronic device of claim 1, wherein the first electrical contact includes a metal layer, located on top of the multi-layered ridge, said metal layer being electrically connected to an uppermost layer of the multi-layered ridge, and also electrically connected to a first contact pad located on an upper surface of the III-V semiconductor cladding.

9. The optoelectronic device of claim 1, wherein the second electrical contact is provided in a via through the III-V semiconductor cladding, said second electrical contact being electrically connected to the slab and a second contact pad located on an upper surface of the III-V semiconductor cladding.

10. The optoelectronic device of claim 1, wherein the Ill-V semiconductor cladding is an epitaxially grown cladding.

11. An optoelectronic device, comprising:
a substrate;
a multi-layered ridge on the substrate, the multi-layered ridge containing an optically active waveguide;
a slab, located between the multi-layered ridge and the substrate, a material of a lowermost layer of the multi-layered ridge being the same as, and continuous with, a material of the slab;
a III-V semiconductor cladding, located adjacent to a first and second sidewall of the multi-layered ridge, and extending from an upper surface of the slab along the first and second sidewalls, thereby cladding the optically active waveguide within the multi-layered ridge; and a first and second electrical contact, which electrically connect to a layer of the multi-layered ridge and the slab respectively, wherein the slab directly contacts a first portion of a top surface of the substrate, and the III-V cladding directly contacts a second portion of the top surface of the substrate adjacent to the first portion.

12. A method of fabricating the optoelectronic-device of claim 1, performed on a multi-layered wafer disposed on the substrate, the method comprising the steps of:

performing one or more etches to the multi-layered wafer, thereby defining the slab and the multi-layered ridge, the slab having the upper surface below the multi-layered ridge and being located between the multi-layered ridge and the substrate;

selectively epitaxially growing the III-V semiconductor cladding adjacent to the first and second sidewalls of the multi-layered ridge, the III-V semiconductor cladding extending from the upper surface of the slab along the first and second sidewalls, and thereby cladding the optically active waveguide within the multi-layered ridge; and providing the first and second electrical contacts, which electrically connect to a layer of the multi-layered ridge and the slab respectively.

13. The method of claim 12, wherein the III-V semiconductor cladding is undoped.

14. The method of claim 12, wherein the III-V semiconductor cladding is doped with iron.

15. The method of claim 12, wherein the III-V semiconductor cladding is formed from one of: InP, GaAs, GaSb, or GaP.

16. The method of claim 12, wherein the multi-layered wafer includes one or more III-V semiconductor layers.

17. The method of claim 12, wherein the optically active waveguide forms a part of one of: a photodiode; an electro-absorption modulator; and a laser.

18. The method of claim 12, wherein the cladding extends from the upper surface of the slab along the first and second sidewalls of the multi-layered ridge to a point equal in height to an upper surface of a doped layer of the multi-layered ridge.

19. The method of claim 12, wherein prior to a first etch of the multi-layered wafer, the method includes depositing a first mask over a region of the multi-layered wafer which is to form the multi-layered ridge, and subsequently etching the unmasked region.

20. The method of claim 19, wherein the first mask is retained after the etching, and is present during the selective epitaxial growth of the III-V semiconductor cladding.

21. The method of claim 19, wherein the first mask is formed of silicon dioxide.

22. The method of claim 19, wherein the first etch extends only part way into a base layer of the multi-layered wafer which is adjacent to the substrate.

* * * * *